United States Patent [19]
Tanabe

[11] Patent Number: 5,351,215
[45] Date of Patent: Sep. 27, 1994

[54] DYNAMIC RANDOM ACCESS MEMORY DEVICE HAVING A TRANSFER CIRCUIT FOR COUPLING A SENSE AMPLIFIER CIRCUIT WITH AN ACCESSED CELL AND A PLATE LINE

[75] Inventor: Akira Tanabe, Tokyo, Japan

[73] Assignee: NEC Corporation, Tokyo, Japan

[21] Appl. No.: 11,734

[22] Filed: Feb. 1, 1993

[30] Foreign Application Priority Data

Feb. 4, 1992 [JP] Japan .................... 4-018006

[51] Int. Cl.$^5$ .......................... G11C 11/34
[52] U.S. Cl. .................... 365/203; 365/190; 365/207
[58] Field of Search .............. 365/203, 190, 207

[56] References Cited
U.S. PATENT DOCUMENTS 5,029,137  7/1991  Hoshi ............... 365/203 X
5,058,073 10/1991  Cho et al. .......... 365/203 X
5,111,434  5/1992  Cho ................... 365/203 X Primary Examiner—Do Hyum Yoo
Attorney, Agent, or Firm—Sughrue, Mion, Zinn, Macpeak & Seas

[57] ABSTRACT

A dynamic random access memory device has memory cells each implemented by a series combination of a switching transistor and a storage capacitor coupled between one of the bit lines of an associated bit line pair and an associated plate line, and an input node of an associated sense amplifier circuit is coupled with the one of the bit lines and blocked from the associated plate line; however, the other input node of the associated sense amplifier circuit is blocked from the other bit line and coupled with the associated plate line so that the storage capacitor can produce relatively large initial differential voltage between the input nodes of the associated sense amplifier circuit.

9 Claims, 11 Drawing Sheets

DYNAMIC RANDOM ACCESS MEMORY DEVICE HAVING A TRANSFER CIRCUIT FOR COUPLING A SENSE AMPLIFIER CIRCUIT WITH AN ACCESSED CELL AND A PLATE LINE

FIELD OF THE INVENTION

This invention relates to a dynamic random access memory device and, more particularly, to a dynamic random access memory device having a transfer circuit for coupling a sense amplifier circuit with an accessed memory cell and a plate line but blocking the sense amplifier circuit from the other bit line.

DESCRIPTION OF THE RELATED ART

A typical example of dynamic random access memory device has memory cell arrays fabricated from one-transistor one-capacitor cells, and the storage capacitors are coupled between the associated switching transistors and a shared voltage line. However, the voltage level on the shared voltage line tends to fluctuate upon access to a data bit stored in one of the memory cells, and the voltage fluctuation is causative of undesirable decrement of electric charges accumulated on other memory cells.

FIG. 1 illustrates a solution of the above described drawback, and comprises a memory cell array 1, a precharge circuit 2, a transfer circuit 3 and a sense amplifier circuit 4. The memory cell array 1 is fabricated from memory cells M1, M2, M3 and M4, and each memory cell is implemented by a series combination of an n-channel enhancement type switching transistor SW1 and a storage capacitor CP1. The drain nodes of the n-channel enhancement type switching transistors are selectively coupled with bit lines BL1 and BL2, and the common electrode of the storage capacitors CP1 is coupled with a plate line PL shared between all of the memory cells M1 to M4. The gate electrodes of the n-channel enhancement type switching transistors SW1 are selectively coupled with word lines WL1, WL2, WL3 and WL4, and the word lines WL1 to WL4 allows one of the n-channel enhancement type switching transistors SW1 to turn on to couple the associated storage capacitor CP1 with the associated bit line BL1 or BL2.

The precharge circuit 2 is fabricated from a plurality of n-channel enhancement type switching transistors SW2, SW3 and SW4, and the n-channel enhancement type switching transistors SW2, SW3 and SW4 are coupled between a middle voltage line HV and the associated bit lines BL1 and BL2 and between the middle voltage line HV and the plate line PL. A power voltage level Vcc and the ground voltage level are respectively indicative of logic "1" level and logic "0" level, and the middle voltage line HV supplies a half of the power voltage level Vcc/2 to the bit lines BL1 and BL2 and the shared plate line PL. The n-channel enhancement type switching transistor SW2 to SW4 are responsive to timing control signals PD1, PD2 and PD3, and turn on at predetermined timing so as to charge the bit lines BL1 and BL2 and the plate line PL to the middle voltage Vcc/2. PCA1, PCA2 and PCA3 stand for parasitic capacitances respectively coupled with the bit lines BL1 and BL2 and the plate line PL.

The transfer circuit 3 has n-channel enhancement type transfer transistors TG1 and TG2 coupled between the plate line PL and the two input nodes of the sense amplifier circuit 4, and are responsive to timing control signals TG3 and TG4 for coupling therebetween. The sense amplifier circuit 4 is activated with a timing control signal SE so as to develop small differential voltage between the input nodes thereof.

The prior art dynamic random access memory device thus arranged behaves as follows. Assuming now that the memory cell M1 is accessed, the timing control signals TG4 and PD1 to PD3 go down to the ground voltage level at time t1, and the timing control signal TG3 remains in a boosted voltage level (Vcc+Vth) higher than the power voltage level Vcc by the threshold of the n-channel enhancement type field effect transistor. The n-channel enhancement type transfer transistor TG1 turns off so as to block the associated bit line BL1 from the plate line PL, and the n-channel enhancement type transfer transistor TG2 continuously couples the plate line PL with the other bit line BL2 and the associated input node of the sense amplifier circuit 4.

The word line WL1 goes up to the boosted voltage level (Vcc+Vth) at time t2, and the n-channel enhancement type switching transistor SW1 of the accessed memory cell M1 turns on so as to couple the accumulation electrode of the storage capacitor CP1 with the associated bit line BL1. Then, the storage capacitor CP1 drives the parasitic capacitance PCA1 coupled with the bit line BL1, and small differential voltage takes place between the bit lines BL1 and BL2.

The timing control signal TG3 goes down to the ground voltage level at time t3, thereby allowing the n-channel enhancement type transfer transistor TG2 to block the associated input node of the sense amplifier circuit 4 from the plate line PL.

The timing control signal PD3 is recovered from the ground voltage level to the power voltage level (Vcc), and the plate line PL is charged to the middle voltage level Vcc/2 again. However, the n-channel enhancement type transfer transistors TG1 and TG2 isolate both input nodes of the sense amplifier circuit 4 from the plate line PL. The timing control signal SE concurrently goes up to the power voltage level Vcc, and the sense amplifier circuit 4 starts on developing the small differential voltage between the input nodes thereof. As a result, the small differential voltage is developed to large differential voltage, and the bit lines BL1 and BL2 reach the power voltage level Vcc and the ground voltage level, respectively. The large differential voltage is indicative of the logic level of the data bit read out from the memory cell M1, and is not only delivered to the outside of the dynamic random access memory device but also restored in the storage capacitor CP1 of the memory cell M1.

Even though the prior art dynamic random access memory device has a plurality of bit line pairs associated with memory cells, every plate line PL is terminated at the associated sense amplifier circuit 4, and, accordingly, voltage fluctuation on the plate line PL does not have any influence on data bits stored in memory cells coupled with the other plate lines. However, the storage capacitor CP1 of the accessed memory cell is still expected to drive large amount of parasitic capacitance, and the differential voltage initially produced by the storage capacitor CP1 is still small.

SUMMARY OF THE INVENTION

It is therefore an important object of the present invention to provide a dynamic random access memory device which initially produces relatively large differential voltage between bit lines.

To accomplish the object, the present invention proposes to cut off a bit line coupled with non-accessed memory cell from a plate line coupled to an accessed memory cell.

In accordance with one aspect of the present invention, there is provided a dynamic random access memory device fabricated on a semiconductor chip, comprising: a) a plurality of memory cells arranged in rows and columns, and respectively fabricated from storage capacitors respectively coupled in series with first switching transistors, every two columns of memory cells forming a column pair so that the columns of the plurality of memory cells being divided into a plurality of column pairs; b) a plurality of bit lines respectively associated with the columns of the plurality of memory cells, and each coupled with drain nodes of the respective first switching transistors of the associated column, every two adjacent bit lines being paired with each other for forming a plurality of bit line pairs; c) a plurality of plate lines respectively associated with the plurality of column pairs and with the plurality of bit line pairs, and each coupled with counter electrodes of the storage capacitors of the associated column pair; d) a plurality of word lines respectively associated with the rows of the plurality of memory cells, and each coupled with gate electrodes of the first switching transistors for selectively coupling the storage capacitors with the associated bit lines at a first timing; e) a precharging means operative to supply a middle voltage level between a high voltage level and a low voltage level to the plurality of bit lines and to the plurality of plate lines at a second timing before the first timing; f) a plurality of sense amplifier circuits respectively associated with the plurality of column pairs, and operative to develop small differential voltages on the respective bit line pairs at a third timing after the first timing; and g) a plurality of transfer circuits respectively coupled between the plurality of bit line pairs and input node pairs of the respective plurality of sense amplifier circuits, and each having a first transfer gate responsive to a first timing signal for coupling one of the bit lines of the associated bit line pair with one of the input nodes of the associated input node pair, a second transfer gate responsive to a second timing signal for coupling the other of the bit lines with the other of the associated input nodes, a third transfer gate responsive to a third timing signal for coupling the associated plate line with the one of the input nodes, and a fourth transfer gate responsive to a fourth timing signal for coupling the associated plate line with the other of the input nodes, the first and fourth timing signals being produced when the plurality of word lines couple one of the storage capacitors with the one of the bit lines between the second timing and the first timing, the second and third timing signals being produced between the second timing and the first timing when the plurality of word lines couple one of the storage capacitors with the other of the bit lines.

In accordance with another aspect of the present invention, there is provided a dynamic random access memory device fabricated on a single semiconductor chip, comprising: a) a plurality of memory cells arranged in rows and at least two columns, and respectively fabricated from storage capacitors respectively coupled in series with first switching transistors; b) at least two bit lines respectively associated with the at least two columns of memory cells, and each coupled with drain nodes of the respective first switching transistors of the associated column; c) at least two plate lines respectively paired with the at least two bit lines for forming at least two data propagation paths respectively associated with the at least two columns of memory cells, and each coupled with counter electrodes of the storage capacitors of the associated column of memory cells; d) a plurality of word lines respectively associated with the rows of the plurality of memory cells, and each coupled with gate electrodes of the first switching transistors of the associated row for selectively coupling the storage capacitors with the associated bit lines at a first timing; e) a precharging means operative to supply a middle voltage level between a high voltage level and a low voltage level to the at least two data propagation paths at a second timing before the first timing; f) at least one first sense amplifier circuit coupled with one of the data propagation paths associated with the first memory cell sub-array, and operative to develop small differential voltages on the associated data propagation path at a third timing after the first timing; g) at least one second sense amplifier circuit coupled with the other of the at least two data propagation paths associated with the second memory cell sub-array, and operative to develop small differential voltages on the associated data propagation path at the third timing; h) at least one first transfer circuit coupled between the aforesaid one of the at least two data propagation paths and an input node pair of the at least one first sense amplifier circuit, and responsive to a first timing signal for coupling the associated data propagation path with the input node pair of the at least one first sense amplifier circuit at a fourth timing between the second and first timings; and i) at least one second transfer circuit coupled between the other of the at least two data propagation paths and an input node pair of the at least one second sense amplifier circuit, and responsive to a second timing signal for coupling the associated data propagation path with the input node pair of the at least one second sense amplifier circuit at the fourth timing.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
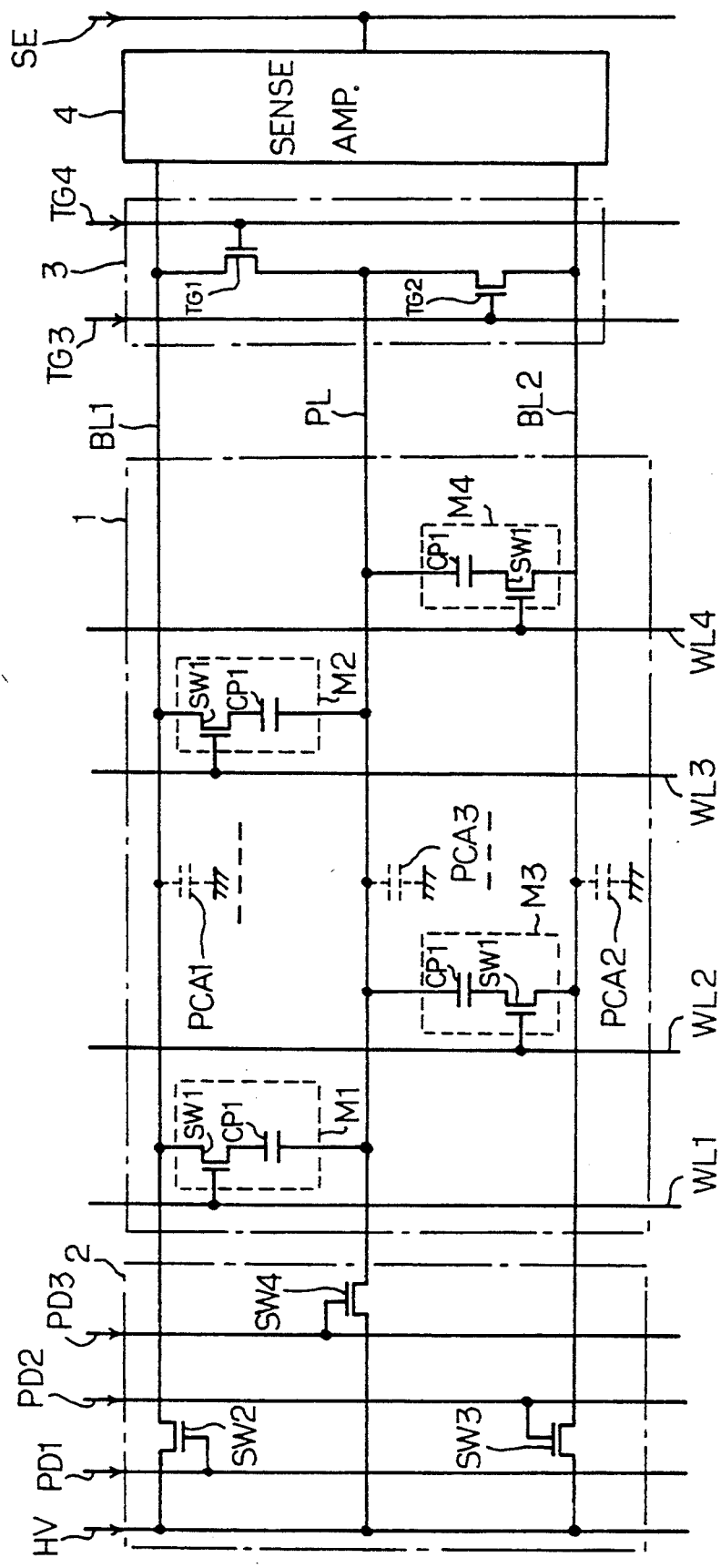
FIG. 1 is a circuit diagram showing the arrangement of the prior art dynamic random access memory device.
Figure 2:
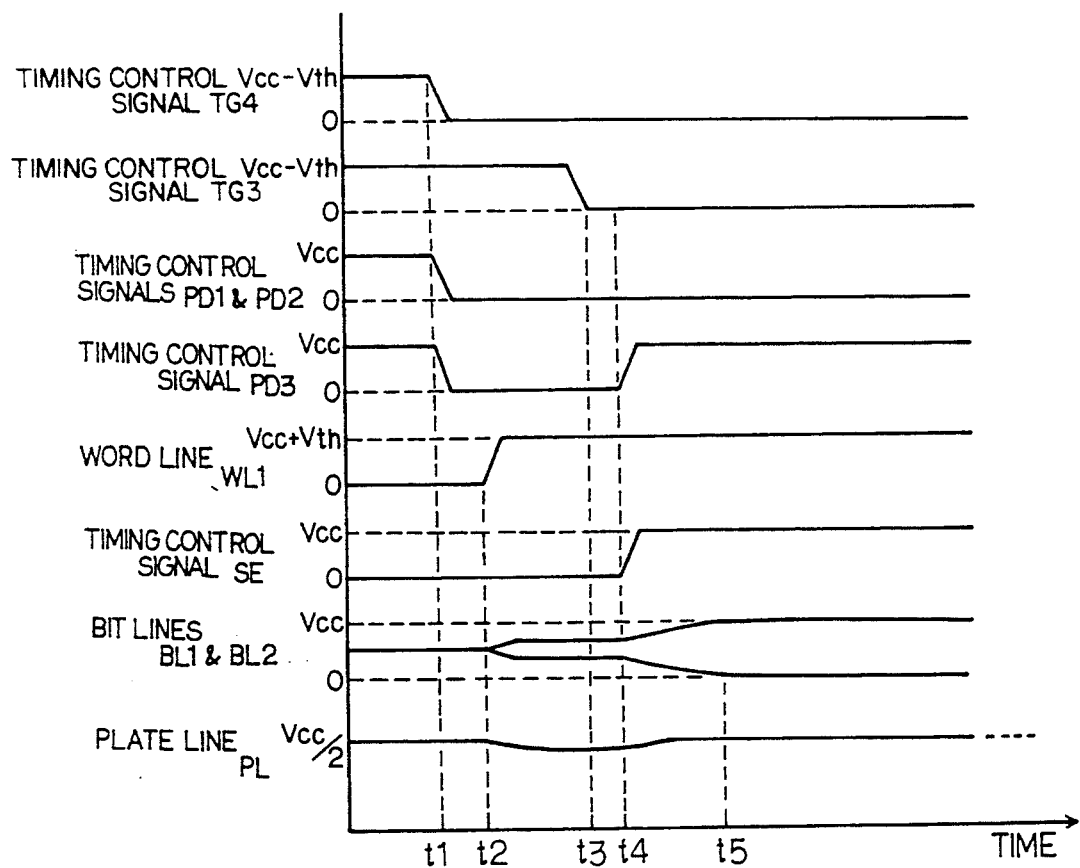
FIG. 2 is a timing chart showing the sequence of the read-out operation carried out by the prior art dynamic random access memory device.
Figure 3:
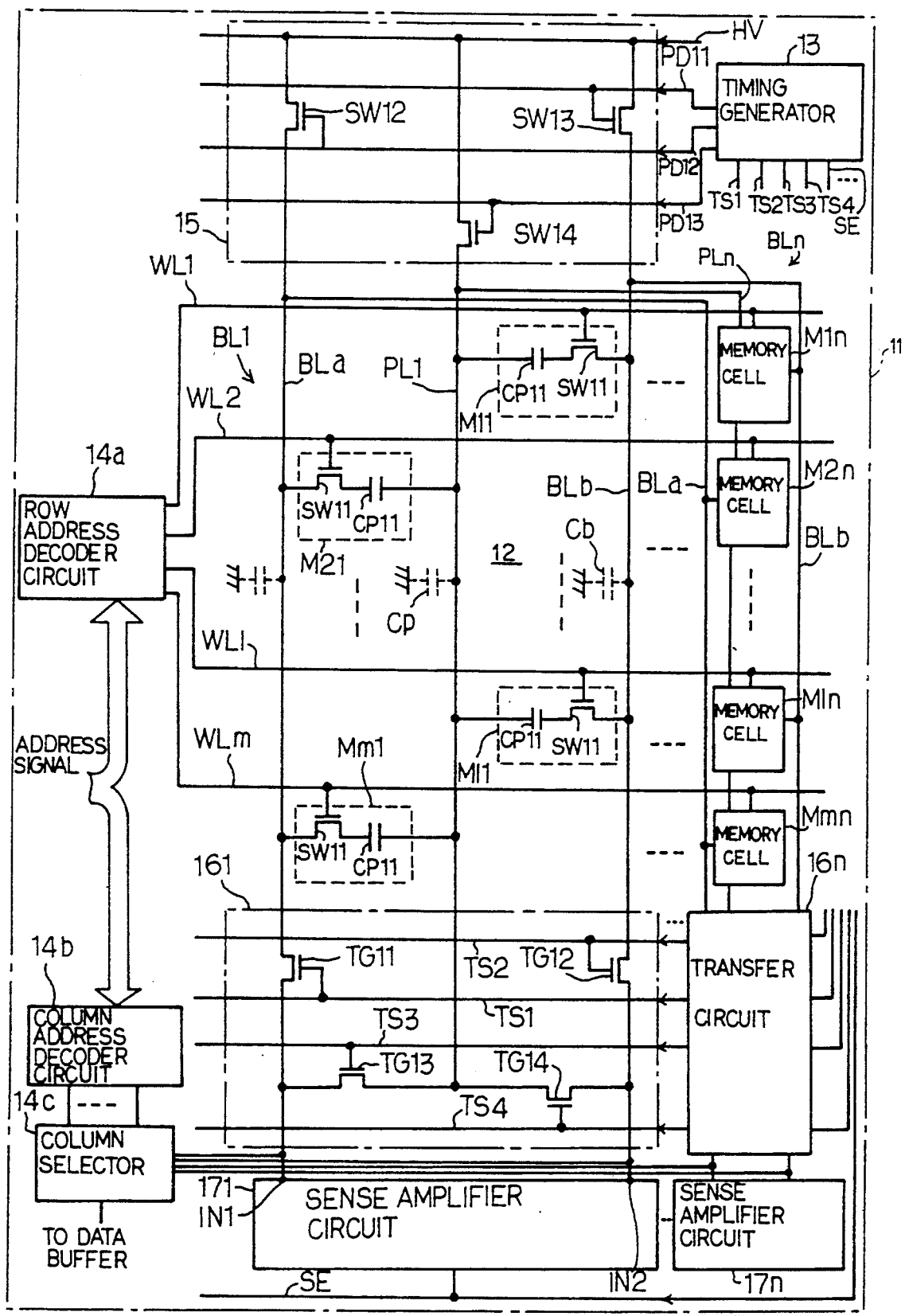
FIG. 3 is a circuit diagram showing the arrangement of a dynamic random access memory device according to the present invention.

Referring to FIG. 3 of the drawings, a dynamic random access memory device embodying the present invention is fabricated on a single semiconductor chip 11, and largely comprises a memory cell array 12, an addressing means, a data discriminating means, and a timing generating circuit 13.

The memory cell array 12 is fabricated from a large number of memory cells M11, M1n, M21, M2n, Ml1, Mln, Mm1 and Mmn arranged in rows and columns, and each memory cell is implemented by a series combination of an n-channel enhancement type switching transistor SW11 and a storage capacitor CP11. A plurality of bit line pairs BL1 to BLn are respectively associated with the columns of the memory cells M11 to Mmn, and are accompanied with a plurality of plate lines PL1 to PLn, respectively. A plurality of word lines WL1, WL2, WL1 and WLm are respectively associated with the rows of the memory cells M11 to Mmn, and the word lines WL1 to WLm are selectively driven to a boosted voltage level (Vcc+Vth) over a power voltage level Vcc for allowing the associated n-channel enhancement type switching transistors SW11 to turn on. Vth is indicative of the threshold of the n-channel enhancement type switching/transfer transistors such as SW11. In this instance, every two adjacent columns of memory cells such as M11 to Ml1 and M21 to Mm1 form a column pair, and are associated with one of the bit line pairs such as BL1 and with one of the plate lines such as PL1. Each of the bit line pairs BL1 to BLn consists of first and second bit lines BLa and BLb.

The addressing means comprises a row address decoder circuit 14a responsive to row address bits of an address signal for driving one of the word lines WL1 to WLm, a column address decoder circuit 14b responsive to column address bits of the address signal for allowing a column selector 14c to couple one of the bit line pairs BL1 to BLn with a data buffer circuit (not shown).

The data discriminating means comprises a precharging circuit 15, a plurality of transfer circuits 161 to 16n and a plurality of sense amplifier circuits 171 to 17n each having a pair of input nodes IN1 and IN2. The precharging circuit 15 has three n-channel enhancement type switching transistors SW12, SW13 and SW14 coupled between a middle voltage line HV and the first bit lines BLa, the second bit lines BLb and the plate lines PL1 to PLn, and the middle voltage line HV propagates a middle voltage level Vcc/2 between the power voltage level Vcc corresponding to logic "1" level and the ground voltage level corresponding to logic "0" level. The n-channel enhancement type switching transistors SW12 to SW14 are responsive to timing control signals PD11, PD12 and PD13, and couples the middle voltage line HV with the bit first and second line pairs BLa and BLb and the plate lines PL1 to PLn for precharging operation.

The transfer circuits 161 to 16n are similar in circuit arrangement, and each of the transfer circuits 161 to 16n comprises a first n-channel enhancement type transfer transistor TG11 coupled between the associated first bit line BLa and the input node IN1, a second n-channel enhancement type transfer transistor TG12 coupled between the associated second bit line BLb and the input node IN2, a third n-channel enhancement type transfer transistor TG13 coupled between the associated plate line and the input node IN1, and a fourth n-channel enhancement type transfer transistor TG14 coupled between the associated plate line and the input node IN2. The first to fourth n-channel enhancement type transfer transistors TG11 to TG14 are respectively responsive to timing control signals TS1 to TS4, and the timing control signals TS1 and TS4 or the timing control signals TS2 and TS3 go up to the boosted voltage level (Vcc+Vth). However, the other timing control signals TS2/TS3 or TS1/TS4 remain in the ground voltage level.

The sense amplifier circuits 171 to 17n are also similar in circuit arrangement, and are operative to develop small differential voltages between the input nodes IN1 and the other input nodes IN2 in response to a timing control signal SE. The timing control signals PD11 to PD13, TS1 to TS4 and SE are sequentially produced by the timing generator 13 when one of the memory cells M11 to Mmn is selected by the address signal. The timing control signals TS1 to TS4, PD11 to PD13 and SE are sequentially produced by the timing generating circuit 13 in every access.

Although the dynamic random access memory device is assisted by other circuits such as a bootstrap circuit for producing the boosted voltage (Vcc+Vth) and a voltage divider for producing the middle voltage Vcc/2, these circuits are known to a person skilled in the art, and no further description is incorporated for the sake of simplicity.

Description is hereinbelow made on a read-out operation with reference to FIG. 4 of the drawings on the assumption that the memory cell M11 is accessed. The description is focused on the bit line pair BL1 associated with the accessed memory cell M11, however, the behavior of the other bit line pairs are analogous to the bit line pair BL1.

If the address signal indicative of the memory cell M11 is supplied from the outside to the dynamic random access memory device, the timing controlling circuit 13 starts on controlling a read-out operation. The timing control signals TS1 to TS4 remain in the boosted voltage level (Vcc+Vth), and allow the n-channel enhancement type transfer transistors TG11 to TG14 to turn on so that the input nodes IN1 and IN2 are coupled with the bit lines BLa and BLb and the plate line PL1. The bit lines BLa and BLb and the plate line PL1 have already been regulated to the middle voltage level Vcc/2.

The timing control signals TS1 and TS4 and the timing control signals PD11 and PD13 go down to the ground voltage level at time t11. Since the timing control signals TS1 and TS4 cause the n-channel enhancement type transfer transistors TG11 and TG14 to turn off, the input node IN1 is blocked from the bit line BLa coupled with non-accessed memory cell M21 to Mm1, and the input node IN2 is cut off from the plate line PL1. However, the timing control signals TS2 and TS3 remain in the boosted voltage level (Vcc+Vth), and the input nodes IN1 and IN2 are continuously coupled with the plate line PL1 and the bit line BLb coupled with the accessed memory cell M11. The timing control signals PD11 and PD13 allow the n-channel enhancement type switching transistors SW13 and SW14 to turn off.

The row address decoder circuit 14a drives the word line WL1 to go up to the boosted voltage level (Vcc+Vth) at time t12, and the n-channel enhancement type switching transistor SW11 of the memory cell M11 turns on for coupling the associated storage capacitor CP11 with the bit line BLb of the bit line pair BL1. Then, the electric charges accumulated therein cause small differential voltage to take place between the input nodes IN1 and IN2. However, only the bit line BLb is charged for the associated input node IN2, because the n-channel enhancement type transfer transistor TG11 isolates the bit line BLa from the input node IN1. This means that the storage capacitor CP11 is expected to drive parasitic capacitance smaller than that of the prior art, and the small differential voltage between the input nodes IN1 and IN2 is larger than that of the prior art.

In detail, the initial differential voltage Vr between the input nodes IN1 and IN2 is calculated as follows.

$$Vr = (Cp + Cb) \times Cs \times Vs / [(Cb + Cs) \times Cp + Cb \times Cs] \quad \text{Equation 1}$$

where Cp is the parasitic capacitance coupled with the plate line PL1, Cb is the parasitic capacitance coupled with the bit line BLb, Cs is the capacitance of the storage capacitor CP11, and Vs is the voltage level of the storage capacitor CP11 before the word line WL1 goes up. From Equation 1, Equation 2 is obtained.

$$dVr/dCp = -Cb^2 \times Cs \times Vs / [(Cb + Cs) \times Cp + Cb \times Cs]^2 < 0 \quad \text{Equation 2}$$

It is understood from Equation 2 that the initial differential voltage Vr is increased by decreasing Cp. In the prior art dynamic random access memory device, the bit line coupled with the non-accessed memory cell is coupled with the associated input node of the sense amplifier circuit, and Cp is equivalent to the sum of Cp and the parasitic capacitance of the bit line. However, the n-channel enhancement type transfer transistor TG11 isolates the input node IN1 from the bit line BLa, and the parasitic capacitance Cp is smaller than that of the prior art.

The timing control signals TS2 and TS3 go down to the ground voltage level at time t13, and the input nodes IN1 and IN2 are perfectly isolated from the bit line pair BL1 and the associated plate line PL1. This results in that the capacitance driven by the sense amplifier circuit 171 is further decreased.

The timing control signals SE and PD13 go up to the power voltage level Vcc, and the timing control signal PD12 goes down to the ground voltage level at time t14. The n-channel enhancement type switching transistor SW14 turns on, and the plate line PL1 is coupled with the middle voltage line Vcc/2. The n-channel enhancement type switching transistor SW12 turns off so that the bit line BLa is isolated from the middle voltage line Vcc/2. Moreover, the sense amplifier circuit 171 is activated, and develops the small differential voltage Vr to large differential voltage.

Figure 4:
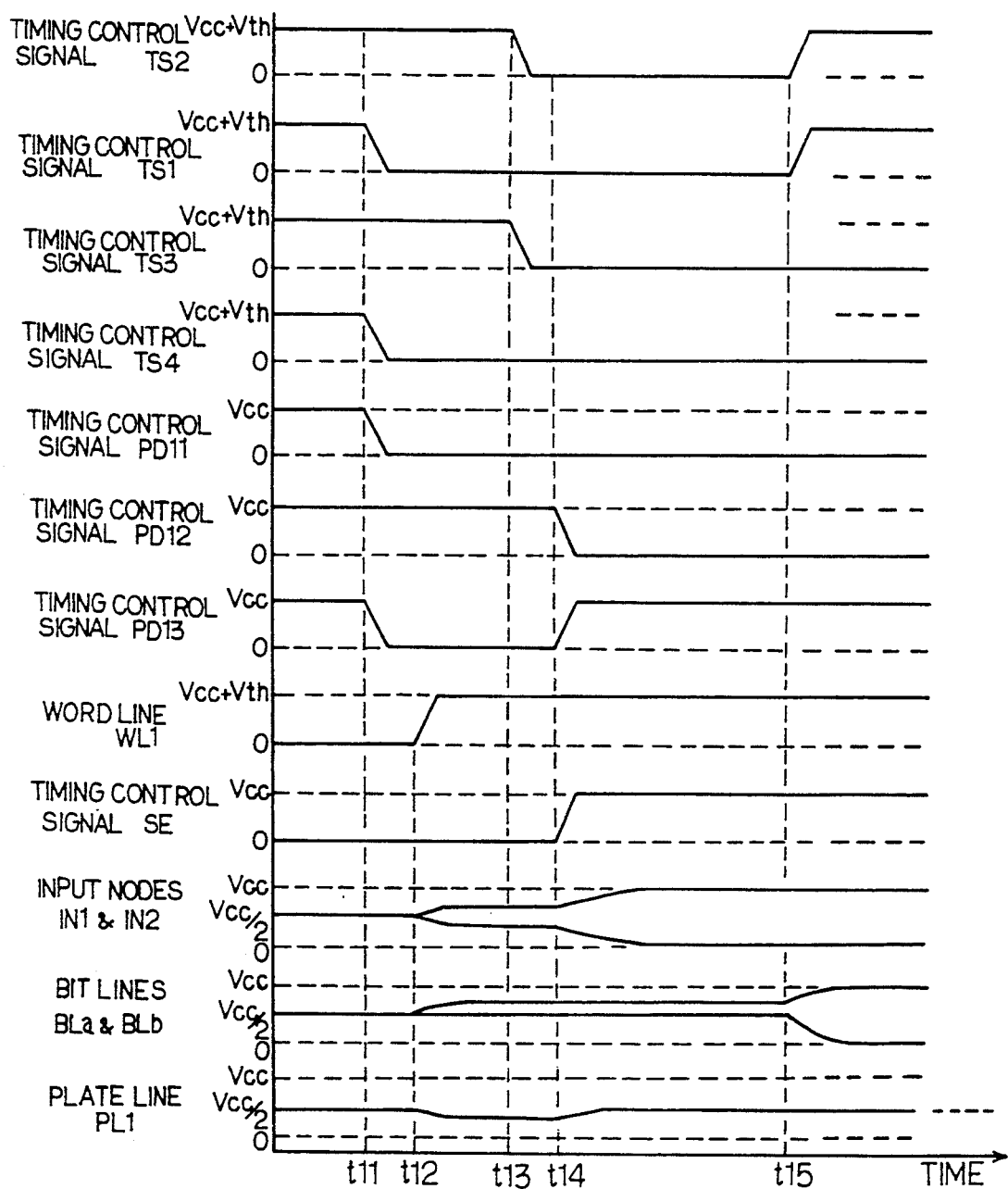
FIG. 4 is a timing chart showing the sequence of the read-out operation carried out by the dynamic random access memory device shown in FIG. 3.

Although FIG. 4 does not illustrate, the column address decoder circuit 14b causes the column selector 14c to transfer the large differential voltage between the input nodes IN1 and IN2 of the sense amplifier circuit 171 to the data buffer circuit (not shown).

The timing control signals TS1 and TS2 go up to the boosted voltage level (Vcc +Vth) at time t15, and the n-channel enhancement type transfer transistors TG11 and TG12 turn on so that the large differential voltage is transferred to the bit lines BLa and BLb. The large differential voltage on the bit line pair BL1 is restored to the storage capacitor CP11 of the memory cell M11.

Second Embodiment

Figure 5:
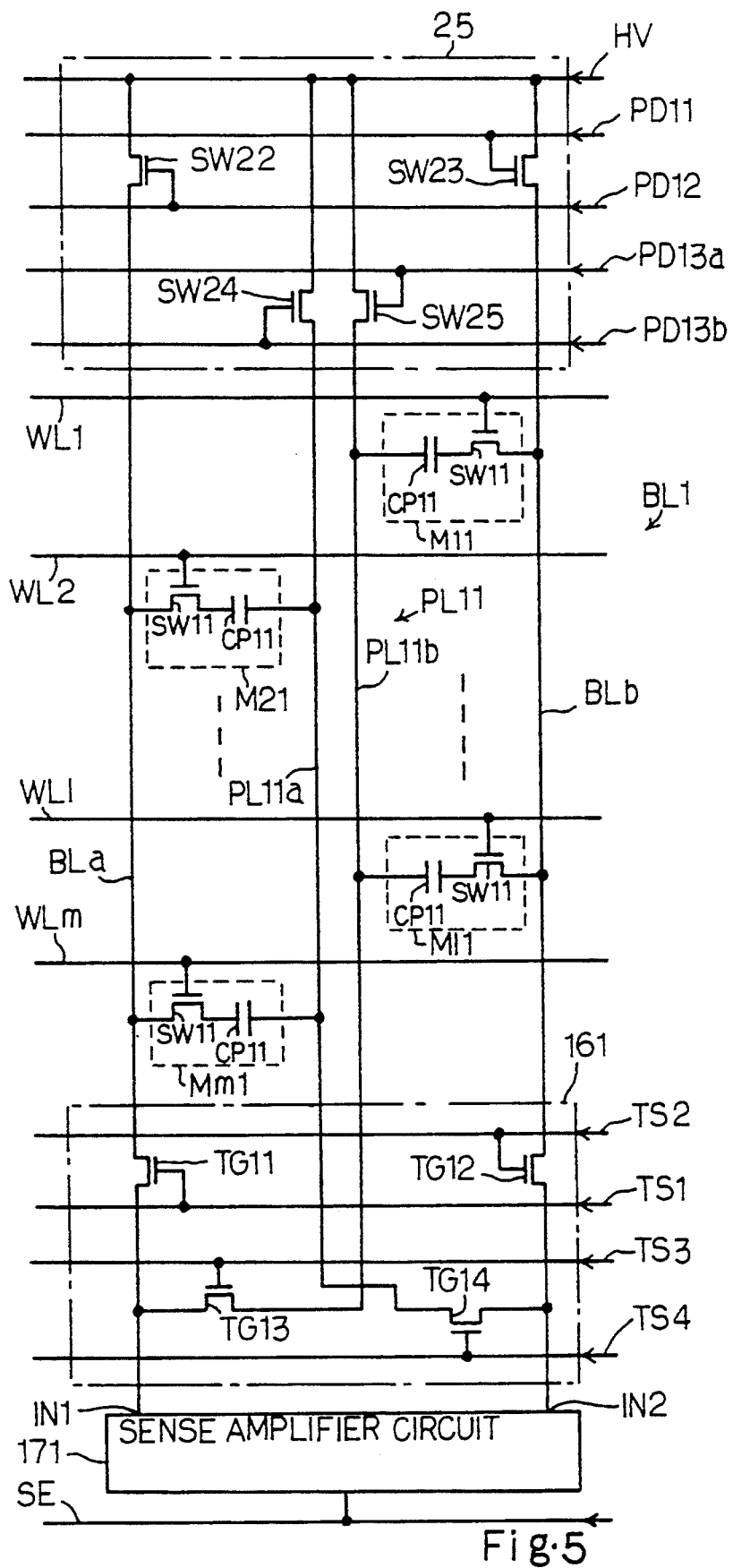
FIG. 5 is a circuit diagram showing the arrangement of a part of another dynamic random access memory device according to the present invention.

Turning to FIG. 5 of the drawings, another dynamic random access memory device embodying the present invention is illustrated. Although FIG. 5 shows only one bit line pair BL1 and the associated circuit, the dynamic random access memory device has a plurality of bit line pairs and associated circuits as similar to the first embodiment. Differences in arrangement from the first embodiment are a plate line PL11 and an associated precharge circuit 25, and the other circuit components are labeled with the same references as corresponding circuit components of the first embodiment without any detailed description for the sake of simplicity.

The plate line PL11 is implemented by a pair of plate sub-lines PL11a and PL11b electrically isolated from one another, and, accordingly, the precharge circuit 25 is fabricated from four n-channel enhancement type switching transistors SW22, SW23, SW24 and SW25. The n-channel enhancement type switching transistors SW22 and SW23 are coupled between the middle voltage line HV and the bit lines BLa and BLb as similar to the first embodiment, and the n-channel enhancement type switching transistors SW24 and SW25 are coupled between the middle voltage line HV and the plate sub-lines PL11a and PL11b. The n-channel enhancement type switching transistors SW24 and SW25 are independently gated with timing control signals PD13b and PD13a, respectively.

Figure 6:
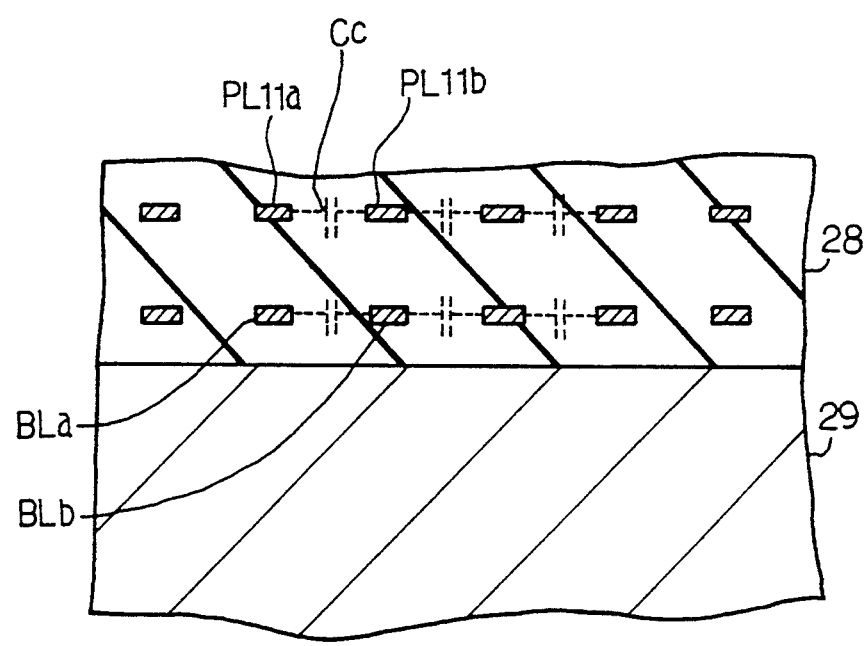
FIG. 6 is a cross sectional view showing the structure of the dynamic random access memory device shown in FIG. 5.

FIG. 6 shows a structure of the dynamic random access memory device implementing the second embodiment, and the bit lines BLa and BLb and the plate sub-lines PL11a and PL11b extend in an inter-level insulating film 28 on a semiconductor substrate 29. In this instance, the plate sub-lines PL11a and PL11b extend over the bit lines BLa and BLb. However, the plate sub-lines PL11a and PL11b are coupled with each other through a parasitic capacitance Cc. If each plate line is not separated into two plate sub-lines, the plate line is capacitively coupled with the adjacent plate line, and noises are liable to affect the adjacent plate lines. However, one of the plate sub-lines PL11a and PL11b serves as a shield line, and noises are hardly propagated from the other plate sub-line to a plate sub-line of the adjacent plate line. Thus, the separated plate sub-lines effectively eliminate noises, and are conducive to exact read-out operation.

Figure 7:
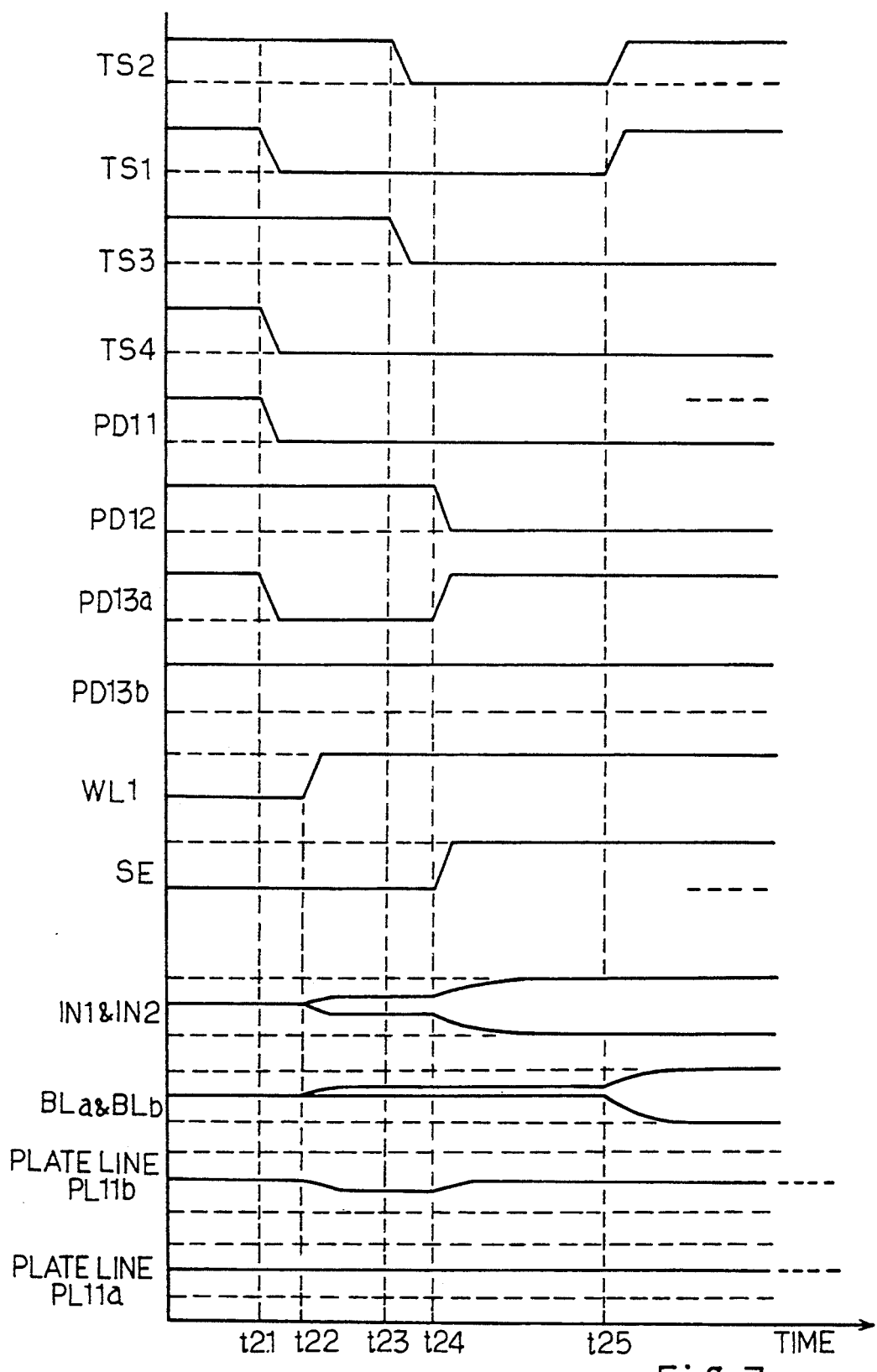
FIG. 7 is a timing chart showing the sequence of the read-out operation carried out by the dynamic random access memory device shown in FIG. 5.

The dynamic random access memory device thus arranged behaves as follows. FIG. 7 illustrates a read-out operation on the memory cell M11. If the address signal indicative of the memory cell M11 is supplied from the outside to the dynamic random access memory device, the timing controlling circuit starts on controlling a read-out operation. The timing control signals TS1 to TS4 remain in the boosted voltage level (Vcc+Vth), and allow the n-channel enhancement type transfer transistors TG11 to TG14 to turn on so that the input nodes IN1 and IN2 are coupled with the bit lines BLa and BLb and the plate sub-lines PL11a and PL11b. The bit lines BLa and BLb and the plate sub-lines PL11a and PL11b have already been regulated to the middle voltage level Vcc/2.

The timing control signals TS1 and TS4 and the timing control signals PD11 and PD13a go down to the ground voltage level at time t21. Since the timing control signals TS1 and TS4 cause the n-channel enhancement type transfer transistors TG11 and TG14 to turn off, the input node IN1 is blocked from the bit line BLa coupled with non-accessed memory cell M21 to Mm1, and the input node IN2 is cut off from the plate sub-line PL11a. However, the timing control signals TS2 and TS3 remain in the boosted voltage level (Vcc+Vth), and the input nodes IN1 and IN2 are continuously coupled with the plate sub-line PL11b and the bit line BLb coupled with the accessed memory cell M11. The timing control signals PD11 and PD13a allow the n-channel enhancement type switching transistors SW23 and SW25 to turn off.

The row address decoder circuit drives the word line WL1 to go up to the boosted voltage level (Vcc+Vth) at time t22, and the n-channel enhancement type switching transistor SW11 of the memory cell M11 turns on for coupling the associated storage capacitor CP11 with the bit line BLb of the bit line pair BL1. Then, the electric charges accumulated therein cause small differential voltage to take place between the input nodes IN1 and IN2. However, only the bit line BLb is charged for the associated input node IN2, because the n-channel enhancement type transfer transistor TG11 isolates the bit line BLa from the input node IN1. Moreover, each of the plate sub-lines PL11a and PL11b is coupled with counter electrodes of a column of the memory cells, and parasitic capacitance coupled with each plate sub-line PL11a or PL11b is a half of the plate line PL1 of the first embodiment. This means that the storage capacitor CP11 is expected to drive parasitic capacitance smaller than that of the first embodiment and much smaller than that of the prior art, and the small differential voltage between the input nodes IN1 and IN2 is much larger than that of the prior art.

The timing control signals TS2 and TS3 go down to the ground voltage level at time t23, and the input nodes IN1 and IN2 are perfectly isolated from the bit line pair BL1 and the associated plate sub-lines PL11a and PL11b. This results in that the capacitance driven by the sense amplifier circuit 171 is further decreased.

The timing control signals SE and PD13a go up to the power voltage level Vcc, and the timing control signal PD12 goes down to the ground voltage level at time t24. The n-channel enhancement type switching transistor SW25 turns on, and the plate sub-line PL11b is coupled with the middle voltage line Vcc/2. The n-channel enhancement type switching transistor SW22 turns off so that the bit line BLa is isolated from the middle voltage line Vcc/2. Moreover, the sense amplifier circuit 171 is activated, and develops the small differential voltage Vr to large differential voltage.

As similar to the first embodiment, the column address decoder circuit causes the column selector to transfer the large differential voltage between the input nodes IN1 and IN2 of the sense amplifier circuit 171 to the data buffer circuit (not shown).

The timing control signals TS1 and TS2 go up to the boosted voltage level (Vcc+Vth) at time t25, and the n-channel enhancement type transfer transistors TG11 and TG12 turn on so that the large differential voltage is transferred to the bit lines BLa and BLb. The large differential voltage on the bit line pair BL1 is restored to the storage capacitor CP11 of the memory cell M11.

Third Embodiment

Figure 8:
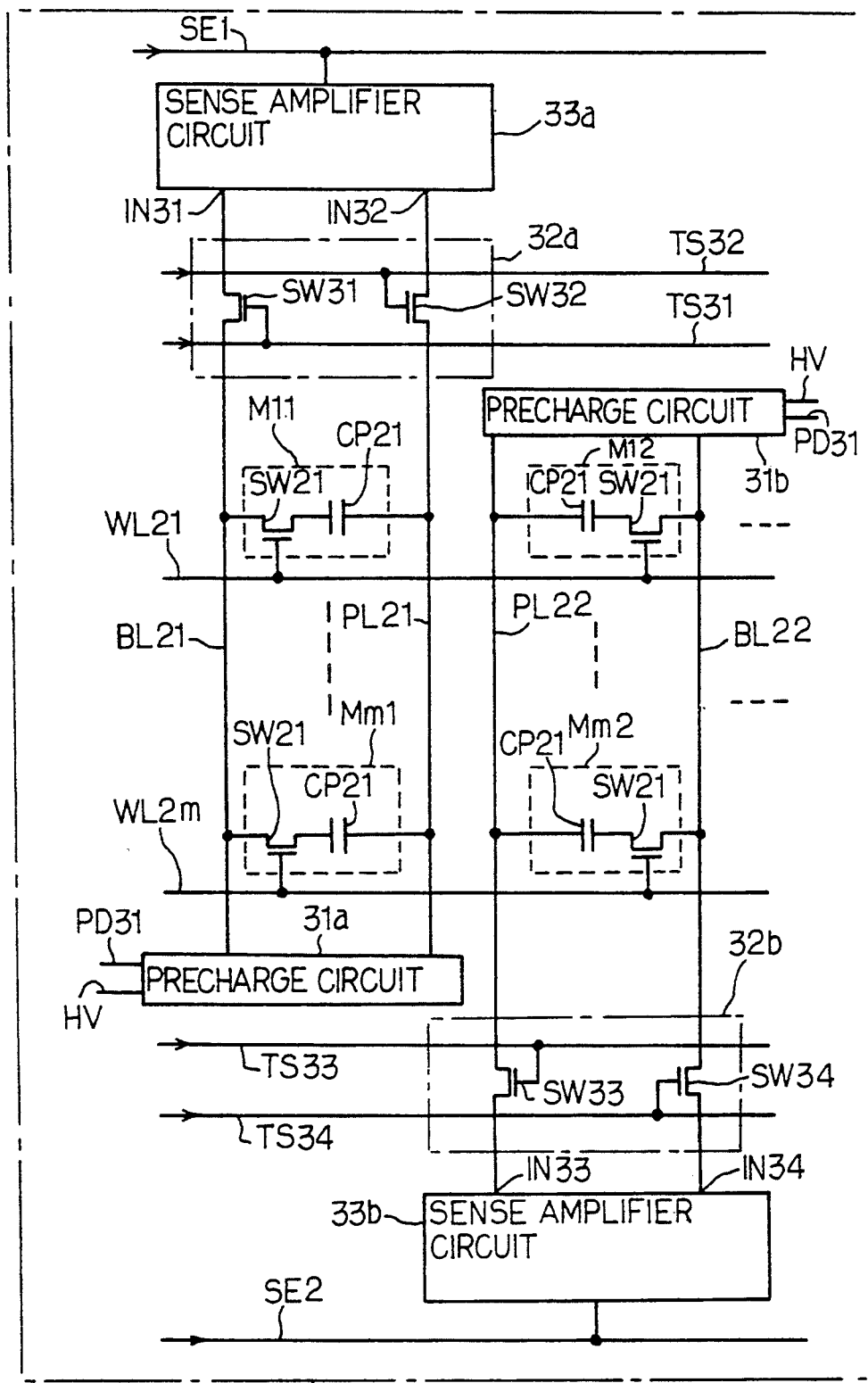
FIG. 8 is a circuit diagram showing the arrangement of yet another dynamic random access memory device according to the present invention.

Turning to FIG. 8 of the drawings, yet another dynamic random access memory device is fabricated on a single semiconductor chip 30. Although only two columns of memory cells are shown in FIG. 8, the dynamic random access memory device implementing the third embodiment has more than two columns of memory cells, and every two columns of memory cells are similar to those shown in FIG. 8.

The dynamic random access memory device comprises a plurality of memory cells M11, M12, Mm1 and Mm2 arranged in two columns, and each of the memory cells M11 to Mm2 is implemented by a series combination of a storage capacitor CP21 and an n-channel enhancement type switching transistor SW21. At least two bit lines BL21 and BL22 are associated with the two columns of memory cells M11 to Mm2, respectively, and are coupled with the drain nodes of the associated n-channel enhancement type switching transistors SW21. At least two plate lines PL21 and PL22 are respectively paired with the bit lines BL21 and BL22, and are coupled with the counter electrodes of the associated storage capacitors CP21. A plurality of word lines WL21 to WL2m are respectively associated with the rows of memory cells M11 to Mm2, and are coupled with the gate electrodes of the associated n-channel enhancement type switching transistors SW21. The bit lines BL21 and BL22 respectively paired with the plate lines PL21 and PL22 form at least two data propagation paths.

The data propagation paths are coupled with precharge circuits 31a and 31b, and are charged to a middle voltage level Vcc/2 between a power voltage level Vcc and a ground voltage level by means of the precharge circuits 31a and 31b. The precharge circuits 31a and 31b are responsive to a timing control signal PD31, and couple the data propagation paths with the middle voltage line HV.

The data propagation paths are terminated at transfer circuits 32a and 32b, respectively, and the transfer circuits 32a and 32b are fabricated from n-channel enhancement type transfer transistors SW31 and SW32 and the n-channel enhancement type transfer transistors SW33 and SW34, respectively. The n-channel enhancement type transfer transistors SW31 and SW32 are concurrently responsive to timing control signals TS31 and TS32 serving as a first timing control signal, and the n-channel enhancement type transfer transistors SW33 and SW34 are also concurrently responsive to timing control signals TS33 and TS34 serving as a second timing control signal.

The transfer circuits 32a and 32b are respectively coupled with sense amplifier circuits 33a and 33b, and are respectively responsive to timing control signals SE1 and SE2. The sense amplifier circuits 33a and 33b are activated with the timing control signals, and develop small differential voltages between input node pairs IN31/IN32 and IN33/IN34 to large differential voltages.

Figure 9:
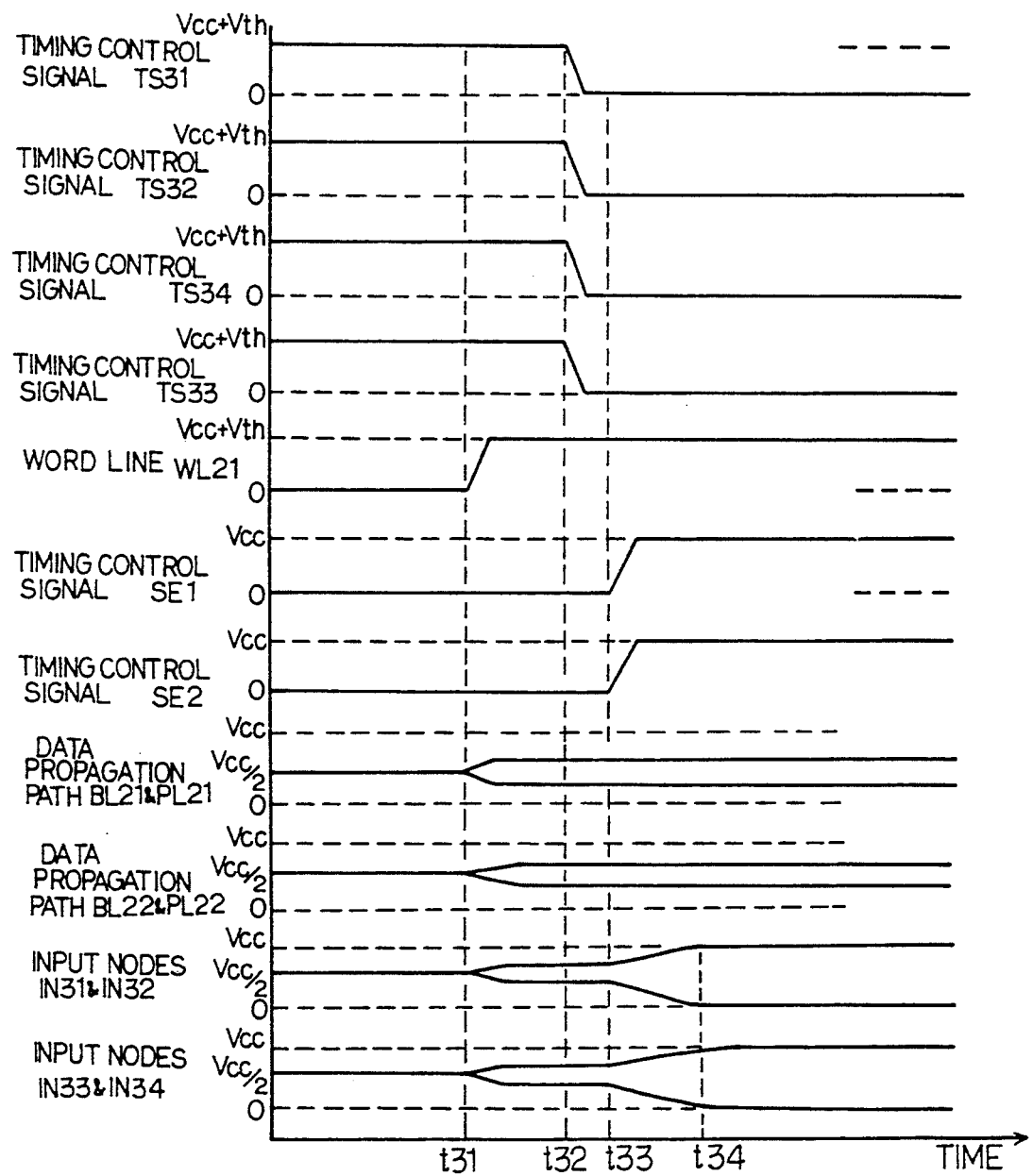
FIG. 9 is a timing chart showing a sequence of a read-out operation carried out by the dynamic random access memory device shown in FIG. 8.

The dynamic random access memory device thus arranged behaves as follows. FIG. 9 illustrates a read-out operation on the memory cell M11. Although not shown in FIG. 9, the timing control signals PD31 allow the precharge circuits 31a and 31b to charge the bit lines BL21 and BL22 and the plate lines PL21 and PL22 to the middle voltage level Vcc/2 before time t31. The timing control signals TS31 to TS34 cause the n-channel enhancement type transfer transistors SW31 to SW34 to turn on, and the bit lines BL21 and BL22 and the plate lines PL21 and PL22 are coupled with the input nodes IN31, IN34, IN32 and IN33, respectively.

One of the word lines WL21 goes up to a boosted voltage level (Vcc+Vth) at time t31, and the n-channel enhancement type switching transistors SW21 of the memory cells M11 and M12 turn on, and the associated storage capacitors CP21 are coupled with the associated bit lines BL21 and BL22. Then, small differential voltages take place between the bit lines BL21 and BL22 and the plate lines PL21 and PL22.

The timing control signals TS31 to TS34 go down to the ground voltage level at time t32, and the n-channel enhancement type transfer transistors SW31 to SW34 turn off so that the input nodes IN31/IN32 and IN33/IN34 are isolated from the associated data propagation paths.

The timing control signals SE1 and SE2 go up to the power voltage level Vcc at time t33, and the sense amplifier circuits 33a and 33b start on increasing the small differential voltages between the input nodes IN31/IN32 and IN33/IN34. Then, the small differential voltages are developed to large differential voltages around time t34, and the large differential voltage between the input nodes IN31 and IN32 is transferred though a column selector (not shown) to a data buffer (not shown). Moreover, the timing control signals TS31 to TS34 go up to the boosted voltage level (Vcc+Vth) again, and the large differential voltages are restored to the memory cells M11 and M12.

The storage capacitor CP21 of the accessed memory cell M11 is expected to a single bit line and a single plate line, and, for this reason, the initial small differential voltage is relatively large rather than the prior art. Moreover, each word line is shared between adjacent two columns, and the number of word lines WL21 to WL2m is smaller than the first and second embodiments.

Fourth Embodiment

Figure 10:
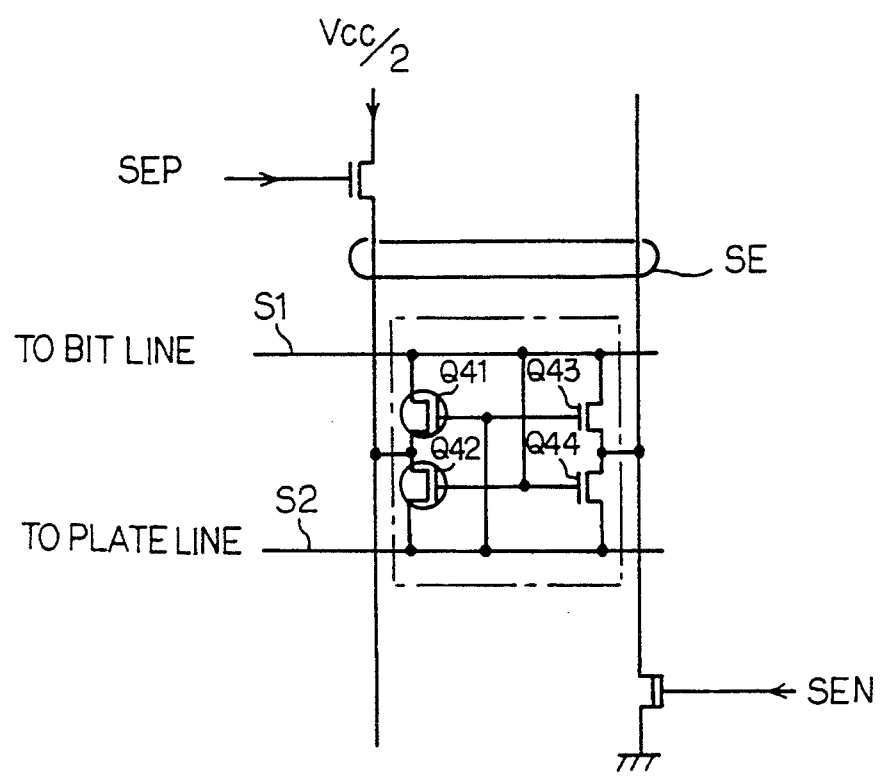
FIG. 10 is a circuit diagram showing the arrangement of a sense amplifier circuit incorporated in a dynamic random access memory device according to the present invention.

Turning to FIG. 10 of the drawings, a sense amplifier circuit incorporated in a dynamic random access memory device embodying the present invention is fabricated from two p-channel enhancement type field effect transistors Q41 and Q42 and two n-channel enhancement type field effect transistors Q43 and Q44 coupled between input nodes S1 and S2 which in turn are coupled with a bit line and a plate line paired therewith. The sense amplifier circuit shown in FIG. 10 is available for any one of the first to third embodiments.

In the first to third embodiments, the plate lines and the bit lines are charged to the middle voltage level Vcc/2, and the sense amplifier circuit develops a small differential voltage to a large differential voltage between the power voltage level Vcc and the ground voltage level. When a data bit is written or rewritten into a memory cell, the word line is boosted to the boosted voltage level (Vcc+Vth) so that the power voltage level is stored or restored in the memory cell.

Figure 11:
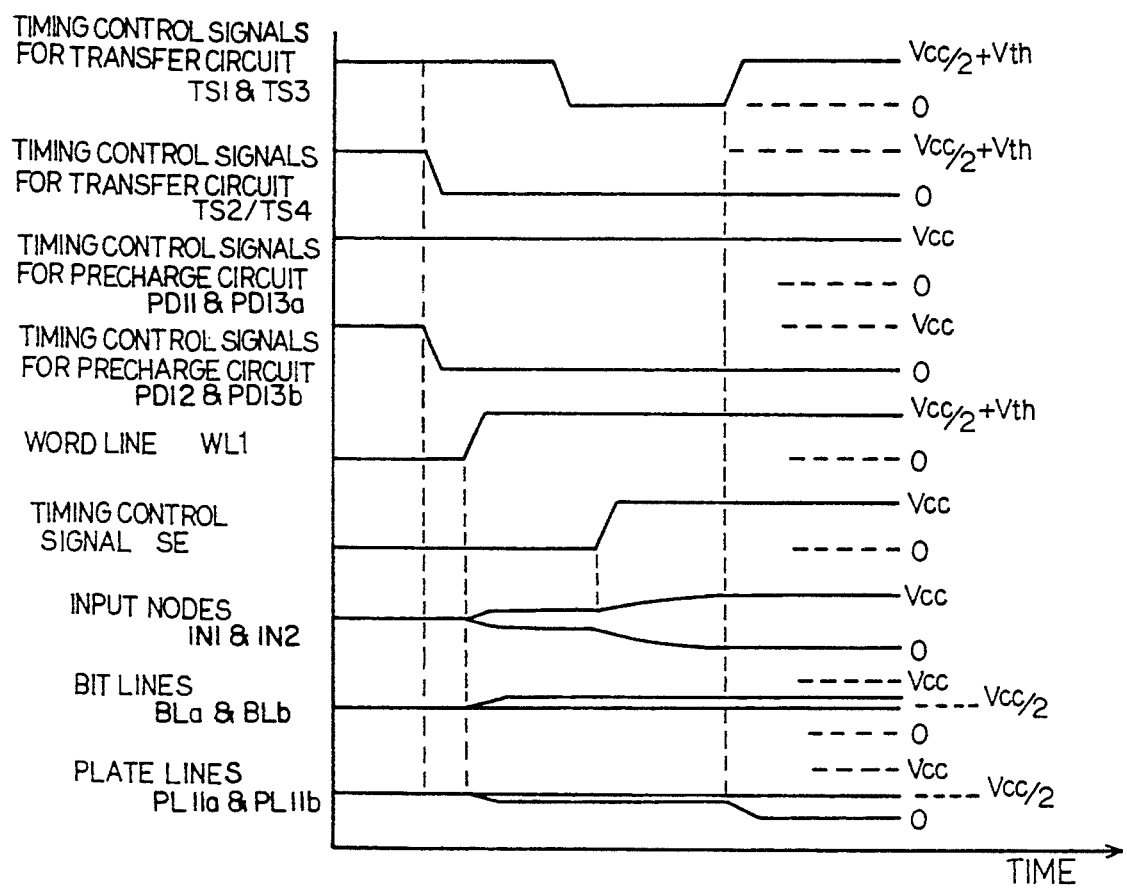
FIG. 11 is a timing chart showing a read-out operation carried out by the fourth embodiment.

However, if the sense amplifier circuit is similar to any one of the first to third embodiments, the timing control signals and the word lines may be controlled as shown in FIG. 11. Namely, the dynamic random access memory device causes the plate line PL11a or PL11b to go down to the ground voltage level and the associated bit line BLa or BLb to go up the middle voltage level Vcc/2 when a data bit of logic "1" level corresponding to a high voltage level is written into a memory cell. On the other hand, if a data bit of logic "0" level corresponding to a low voltage level is written into the memory cell, the bit line BLa or BLb goes down to the ground voltage level, and the associated plate line PL11a or PL11b goes up to the middle voltage level Vcc/2. Thus, the timing control signals TS1, TS3, TS2 and TS4 for a transfer circuit and the word line WL1 are lifted to a certain voltage level (Vcc/2+Vth), and any bootstrap circuit is not incorporated in the dynamic random access memory device.

In the timing chart shown in FIG. 11, the timing control signals TS1 to TS4 and the word line WL1 restrict the amplitude of the bit lines. However, as shown in FIG. 10, if the sense amplifier circuit is powered with the middle voltage level Vcc/2, the sense amplifier circuit can restrict the amplitude, and the bit lines are exactly regulated to the middle voltage level Vcc/2.

Additionally, the timing control signals TS1 to TS4 and the word line WL1 may be lifted over the certain voltage level (Vcc/2+Vth) in so far as the high voltage level does not exceed the power voltage level Vcc.

Although particular embodiments of the present invention have been shown and described, it will be obvious to those skilled in the art that various changes and modifications may be made without departing from the spirit and scope of the present invention. For example, each of the n-channel enhancement type transfer transistors TG11 to TG14 may be implemented by parallel combinations of a p-channel enhancement type field effect transistor and an n-channel enhancement type field effect transistor.

What is claimed is:

1. A dynamic random access memory device fabricated on a semiconductor chip, comprising:
   a) a plurality of memory cells arranged in rows and columns, and respectively fabricated from storage capacitors respectively coupled in series with first switching transistors, every two columns of memory cells forming a column pair so that said columns of said plurality of memory cells are divided into a plurality of column pairs;
   b) a plurality of bit lines respectively associated with said columns of said plurality of memory cells, each of said plurality of bit lines being coupled with drain nodes of said respective first switching transistors of the associated column, every two adjacent bit lines being paired with each other for forming a plurality of bit line pairs;
   c) a plurality of plate lines respectively associated with said plurality of column pairs and with said plurality of bit line pairs, each of said plurality of plate lines being coupled with counter electrodes of said storage capacitors of the associated column pair;
   d) a plurality of word lines respectively associated with said rows of said plurality of memory cells, each of said plurality of word lines being coupled with gate electrodes of said first switching transistors of the associated row for selectively coupling said storage capacitors with the associated bit lines at a first timing;
   e) a precharging means operative to supply a middle voltage level between a high voltage level and a low voltage level to said plurality of bit lines and to said plurality of plate lines at a second timing before said first timing;

f) a plurality of sense amplifier circuits respectively associated with said plurality of column pairs, and operative to develop small differential voltages on said respective bit line pairs at a third timing after said first timing; and g) a plurality of transfer circuits respectively coupled between said plurality of bit line pairs and input node pairs of said respective plurality of senses amplifier circuits, each of said plurality of transfer circuits having a first transfer gate responsive to a first timing signal for coupling one of the bit lines of the associated bit line pair with one of the input nodes of the associated input node pair, a second transfer gate responsive to a second timing signal for coupling the other of said bit lines with the other of said associated input nodes, a third transfer gate responsive to a third timing signal for coupling the associated plate line with said one of said input nodes, and a fourth transfer gate responsive to a fourth timing signal for coupling said associated plate line with said other of said input nodes, said first and fourth timing signals being produced when said plurality of word lines couple one of the storage capacitors with said one of said bit lines between said second timing and said first timing, said second and third timing signals being produced between said second timing and said first timing when said plurality of word lines couple one of the storage capacitors with said other of said bit lines.

2. A dynamic random access memory device as set forth in claim 1, in which said first and fourth transfer gates or said second and third transfer gates turn off at fourth timing between said first and third timings.

3. A dynamic random access memory device as set forth in claim 1, in which each of said plurality of plate lines has first and second plate sub-lines electrically isolated from each other, and said first and second plate sub-lines are respectively associated with said other of said input nodes and said one of said input nodes.

4. A dynamic random access memory device as set forth in claim 3, in which said first and second plate sub-lines of one of said plurality of plate lines extend together with the first and second plate sub-lines of another plate line on a predetermined level in an inter-level insulating film structure.

5. A dynamic random access memory device as set forth in claim 1, in which one of said bit lines is kept at either said middle or a ground voltage level and the associated plate line is kept at either said ground or said middle voltage level after said third timing by restricting said first to fourth timing signals to a certain voltage level higher than said middle voltage level by a threshold level of said first to fourth transfer gates.

6. A dynamic random access memory device as set forth in claim 1, in which said plurality of sense amplifier circuits are powered with said middle voltage level.

7. A dynamic random access memory device fabricated on a single semiconductor chip, comprising:

a) a plurality of memory cells arranged in rows and at least two columns, and respectively fabricated from storage capacitors respectively coupled in series with first switching transistors;

b) at least two bit lines respectively associated with said at least two columns of memory cells, and each of said at least two bit lines being coupled with drain nodes of said respective first switching transistors of the associated column;

c) at least two plate lines respectively paired with said at least two bit lines for forming at least two data propagation paths respectively associated with said at least two columns of memory cells, and each of said at least two plate lines being coupled with counter electrodes of said storage capacitors of the associated column of memory cells;

d) a plurality of word lines respectively associated with said rows of said plurality of memory cells, and each of said plurality of word lines being coupled with gate electrodes of said first switching transistors of the associated row for selectively coupling said storage capacitors with the associated bit lines at a first timing;

e) a precharging means operative to supply a middle voltage level between a high voltage level and a low voltage level to said at least two data propagation paths at a second timing before said first timing;

f) at least one first sense amplifier circuit coupled with a first one of said at least two data propagation paths, and operative to develop small differential voltages on said first one of said at least two data propagation paths at a third timing after said first timing;

g) at least one second sense amplifier circuit coupled with a second one of said at least two data propagation paths, and operative to develop small differential voltages on said second one of said at least two data propagation paths at said third timing;

h) at least one first transfer circuit coupled between said first one of said at least two data propagation paths and an input node pair of said at least one first sense amplifier circuit, and responsive to a first timing signal for coupling the first one of said at least two data propagation paths with said input node pair of said at least one first sense amplifier circuit at a fourth timing between said second and first timings; and i) at least one second transfer circuit coupled between said second one of said at least two data propagation paths and an input node pair of said at least one second sense amplifier circuit, and responsive to a second timing signal for coupling said second one of said at least two data propagation paths with said input node pair of said at least one second sense amplifier circuit at said fourth timing.

8. A dynamic random access memory device as set forth in claim 7, in which one of said bit lines is kept at either said middle or a ground voltage level and the associated plate line is kept at either said ground or said middle voltage level after said third timing by restricting said first and second timing signals to a certain voltage level higher than said middle voltage level by a threshold level of said first and second transfer circuits.

9. A dynamic random access memory device as set forth in claim 7, in which said first and second sense amplifier circuits are powered with said middle voltage level.

* * * * *

UNITED STATES PATENT AND TRADEMARK OFFICE
CERTIFICATE OF CORRECTION

PATENT NO. : 5,351,215

DATED : September 27, 1994

INVENTOR(S) : Akira TANABE

It is certified that error appears in the above-identified patent and that said Letters Patent is hereby corrected as shown below:

Col. 5, line 42, delete the 2nd occurrance of "M11"; insert --M11--.

Signed and Sealed this

Seventeenth Day of January, 1995

Attest:

BRUCE LEHMAN

Attesting Officer

Commissioner of Patents and Trademarks